United States Patent
Jha et al.

(10) Patent No.: US 10,273,022 B2
(45) Date of Patent: Apr. 30, 2019

(54) AIRCRAFT LED LIGHT UNIT

(71) Applicant: Goodrich Lighting Systems GmbH, Lippstadt (DE)

(72) Inventors: Anil Kumar Jha, Lippstadt (DE); Norbert Menne, Paderborn (DE); Elmar Schrewe, Anroechte (DE); Robert Trinschek, Hamm (DE); Andre Hessling-von Heimendahl, Koblenz (DE)

(73) Assignee: GOODRICH LIGHTING SYSTEMS GMBH, Lippstadt (DE)

( * ) Notice: Subject to any disclaimer, the term of this patent is extended or adjusted under 35 U.S.C. 154(b) by 125 days.

(21) Appl. No.: 15/209,895

(22) Filed: Jul. 14, 2016

(65) Prior Publication Data
US 2017/0015435 A1    Jan. 19, 2017

(30) Foreign Application Priority Data
Jul. 17, 2015  (EP) .................................... 15177327

(51) Int. Cl.
*B64D 47/02*   (2006.01)
*H05K 1/05*    (2006.01)
(Continued)

(52) U.S. Cl.
CPC .............. *B64D 47/02* (2013.01); *F21V 23/04* (2013.01); *H05K 1/053* (2013.01); *H05K 1/056* (2013.01);
(Continued)

(58) Field of Classification Search
CPC ........ B64D 47/02; F21V 23/04; H05K 1/053; H05K 1/056; H05K 1/181
See application file for complete search history.

(56) References Cited

U.S. PATENT DOCUMENTS 7,821,027 B2 * 10/2010 Shin ...................... H01L 33/647
                                                                257/100
8,440,500 B2    5/2013 Su et al.
(Continued)

FOREIGN PATENT DOCUMENTS

CN        201845773 U    5/2011
CN        203136323 U    8/2013
(Continued)

OTHER PUBLICATIONS

European Search Report for Application No. 15177327.2-1803 dated Jan. 20, 2016; 8 Pages.

*Primary Examiner* — Anh T Mai
*Assistant Examiner* — Nathaniel J Lee
(74) *Attorney, Agent, or Firm* — Cantor Colburn LLP (57) ABSTRACT

An aircraft LED light unit comprises at least one printed circuit board which comprises at least one metal core layer and at least one dielectric layer, and at least one LED disposed on the printed circuit board and which comprises an anode and a cathode for electrically coupling to a power source. One of the anode and cathode of the at least one LED is connected to an electrical conductor which is disposed on the dielectric layer and is coupled to a first terminal of the power source, wherein the dielectric layer electrically isolates the electrical conductor from the metal core layer, and the other one of the anode and cathode of the at least one LED is connected to the metal core layer of the at least one printed circuit board, wherein the metal core layer is coupled to a second terminal of the power source.

13 Claims, 6 Drawing Sheets

(51) Int. Cl.
*H05K 1/18* (2006.01)
*F21V 23/04* (2006.01)
*H05K 3/34* (2006.01)

(52) U.S. Cl.
CPC ........... *H05K 1/181* (2013.01); *H05K 3/3431* (2013.01); *H05K 2201/10106* (2013.01); *H05K 2201/10484* (2013.01); *Y02P 70/611* (2015.11)

(56) References Cited

U.S. PATENT DOCUMENTS

| | | | |
|---|---|---|---|
| 8,523,418 B2 | 9/2013 | Wu | |
| 8,714,764 B2* | 5/2014 | Yamashita | G02F 1/133609 |
| | | | 362/249.02 |
| 2007/0080360 A1 | 4/2007 | Mirsky et al. | |
| 2008/0137353 A1* | 6/2008 | Larsen | B64D 47/04 |
| | | | 362/470 |
| 2012/0061695 A1 | 3/2012 | Kim | |
| 2014/0168979 A1 | 6/2014 | Lai | |
| 2014/0319200 A1* | 10/2014 | Sakai | G03G 15/5054 |
| | | | 228/180.22 |

FOREIGN PATENT DOCUMENTS

| | | |
|---|---|---|
| DE | 102012223287 A1 | 6/2014 |
| WO | 2008123765 A1 | 10/2008 |
| WO | 2012050333 A2 | 4/2012 |

* cited by examiner

AIRCRAFT LED LIGHT UNIT

FOREIGN PRIORITY

This application claims priority to European Patent Application No. 15 177 327.2 filed Jul. 17, 2015, the entire contents of which is incorporated herein by reference.

TECHNICAL FIELD

The present invention relates to aircraft lighting systems, in particular, to an aircraft LED light unit and an aircraft comprising such aircraft LED light unit.

BACKGROUND

LED based lighting systems in aircrafts are known which comprise one or more LEDs (Light Emitting Diodes) which are mounted on one or more printed circuit boards (PCB) together with a power supply and control circuit(s) and which are interconnected by conductive paths on the printed circuit board. LED technology offers a number of advantages. For example, besides being highly cost-effective and having a long lifetime, power consumption is significantly lower than in other lighting systems with bulbs or the like.

Performance of an LED regarding light emission is very sensitive to the LED junction temperature. Roughly speaking, it can be said that in most operating regions the lower the temperature, the better the LED performance. Typically, above a particular threshold temperature, the LED may be damaged, therefore in typical applications an LED junction is thermally connected to the PCB and then to a heat sink to keep the temperature as low as possible.

The problem of high temperatures is pertaining particularly to high power LEDs which have no (electrically isolated) thermal pad (such as a pad made of copper for good thermal conductivity), i.e. only have cathode and anode pads that are responsible for thermal transfer from the LED junction to the PCB. The situation is worse if the number of LEDs arranged in an array on a PCB is very close to each other.

Figure 1:
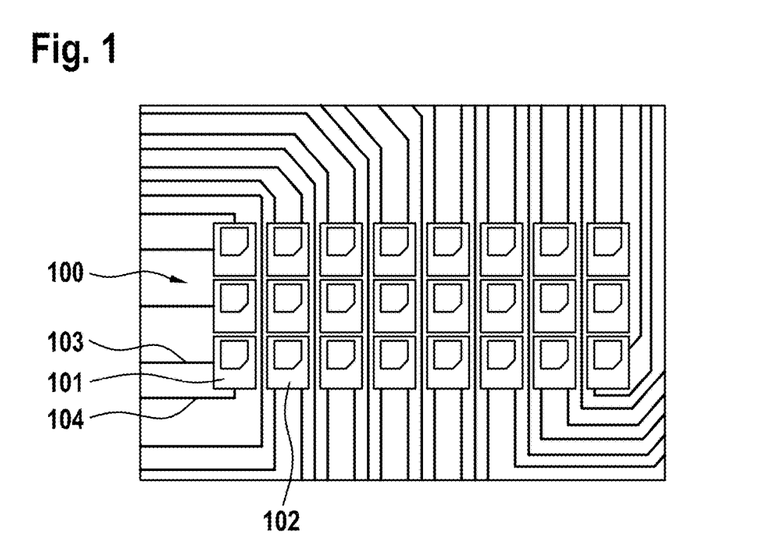
FIG. 1 shows an exemplary LED array 100 arranged on a PCB according to a previous approach.

FIG. 1 shows an exemplary LED array 100 arranged on a PCB according to a previous approach in which multiple LEDs (such as LEDs 101, 102, etc.) are arranged in an array, with their anodes and cathodes (not shown as they are below the respective LED housing) connected to conductor paths, such as shown at 103 and 104.

In such case, the surface area of the conductor paths to the respective cathodes and anodes is limited by the confined spacing between the LEDs of the array, which necessitates relatively thin or narrow electrical conductors or traces on the PCB. Hence the thermal transfer is limited which results in higher LED junction temperatures, which then results in reduced LED performance and efficiency, particularly reduced light emission.

Accordingly, it would be beneficial to provide an aircraft LED light unit that exhibits increased LED efficiency.

SUMMARY

Exemplary embodiments of the invention include an aircraft LED light unit comprising at least one printed circuit board which comprises at least one metal core layer and at least one dielectric layer, and at least one LED disposed on the printed circuit board and which comprises an anode and a cathode for electrically coupling to a power source. One of the anode and cathode of the at least one LED is connected to an electrical conductor which is disposed on the dielectric layer and is coupled to a first terminal of the power source, wherein the dielectric layer electrically isolates the electrical conductor from the metal core layer, and the other one of the anode and cathode of the at least one LED is connected to the metal core layer of the at least one printed circuit board, wherein the metal core layer is coupled to a second terminal of the power source. Thus, there is increased thermal transfer of heat resulting from power dissipation from the LED junction to the metal core layer through one of the anode and cathode of the respective LED, which results in higher LED performance and efficiency due to lower LED junction temperatures.

The power source may be a power supply circuit, receiving power from an outside power network and conditioning the power for supply to the one or more LEDs. The terms power source and power supply are used interchangeably herein.

The aircraft LED light unit may comprise one printed circuit board (PCB) that carries a plurality of LEDs or may have a plurality of printed circuit boards that are interconnected, such as mechanically coupled via matching contours and/or mechanical connectors and electrically coupled via suitable electric connections, with a plurality of LEDs being distributed among the plurality of printed circuit boards. Each of the printed circuit boards may carry a respective array of LEDs.

According to an embodiment, the other one of the anode and cathode of the at least one LED is connected to the metal core layer by a soldering material arranged between the other one of the anode and cathode and the metal core layer, and the soldering material is arranged in an opening of the dielectric layer in which the metal core layer is not covered by the dielectric layer.

Particularly, according to an embodiment, the at least one LED has an emission plane from which light radiation is emitted by the LED, and the soldering material has an extension between the printed circuit board and the LED, the extension being dimensioned so that the emission plane of the at least one LED is substantially parallel to the printed circuit board.

According to an embodiment, the aircraft LED light unit further comprises a first soldering material arranged between the one of the anode and cathode of the at least one LED and the electrical conductor, and a second soldering material arranged between the other one of the anode and cathode of the at least one LED and the metal core layer, wherein the second soldering material has a greater extension between the printed circuit board and the LED than the first soldering material.

Particularly, according to an embodiment, the first soldering material has a first extension between the printed circuit board and the LED and the second soldering material has a second extension between the printed circuit board and the LED. The second extension is substantially equal to the sum of the first extension and the thicknesses of layers arranged between the one of the anode and cathode of the at least one LED and the metal core layer.

According to an embodiment, the at least one LED has an emission plane from which light radiation is emitted by the LED, and the emission plane of the at least one LED is tilted with respect to the printed circuit board.

According to an embodiment, the aircraft LED light unit comprises a plurality of LEDs arranged on the printed circuit board, wherein each of the plurality of LEDs has an emission plane from which light radiation is emitted by the respective LED, and the emission plane of at least one of the plurality of LEDs is tilted with respect to the printed circuit board and the emission plane of at least another one of the plurality of LEDs is substantially parallel to the printed circuit board. Particularly, according to an embodiment, the at least one of the plurality of LEDs having the tilted emission plane is arranged in a periphery of the plurality of LEDs, such as in the periphery of an array of LEDs. A periphery of the plurality of LEDs may comprise one or more rows and/or columns of LEDs which are arranged at one or more edges of an array of LEDs.

According to an embodiment, the aircraft LED light unit comprises at least a first and a second LED coupled in series to the power source, wherein each of the first and second LED has a first terminal and a second terminal, and a switch coupled between the first and second LED. The switch has a controlled path coupled to the second terminal of the first LED and to the first terminal of the second LED. The switch further has a control terminal which is coupled to the first terminal of the first LED.

Particularly, according to an embodiment, the aircraft LED light unit comprises at least four LEDs coupled in series to the power source, which results in higher efficiency and limits the maximum current.

According to an embodiment, the aircraft LED light unit comprises a plurality of LEDs arranged on the printed circuit board in an array of LEDs, wherein one of the anode and cathode of each one of the plurality of LEDs is coupled to the first terminal of the power source, and the other one of the anode and cathode of each one of the plurality of LEDs is connected to the metal core layer which is coupled to the second terminal of the power source.

According to an embodiment, the aircraft LED light unit comprises a plurality of LEDs arranged in at least a first array of LEDs on a first printed circuit board and a second array of LEDs on a second printed circuit board, wherein one of the anode and cathode of each one of the plurality of LEDs in the first array is coupled to the first terminal of the power source, and the other one of the anode and cathode of each one of the plurality of LEDs in the first array is connected to the metal core layer of the first printed circuit board, and one of the anode and cathode of each one of the plurality of LEDs in the second array is coupled to the metal core layer of the first printed circuit board, and the other one of the anode and cathode of each one of the plurality of LEDs in the second array is connected to the metal core layer of the second printed circuit board which is coupled to the second terminal of the power source.

According to a further embodiment, the aircraft LED light unit comprises a plurality of switches, wherein each one of the plurality of switches is coupled between the metal core layer of the first printed circuit board and a respective LED of the second array. Each one of the switches has a controlled path coupled to the metal core layer of the first printed circuit board and to one of the anode and cathode of the respective LED of the second array, and each one of the switches further has a control terminal which is coupled to the first terminal of the power source.

According to exemplary embodiments, the printed circuit board, or the first printed circuit board and second printed circuit board (and any further printed circuit board, if any), respectively, is comprised in a projector module. Particularly, according to an embodiment, the projector module comprises at least four arrays of LEDs, with each one of the arrays being arranged on a respective one of the printed circuit boards.

According to an embodiment, the aircraft LED light unit is an exterior aircraft LED light unit. Particularly, according to an embodiment, the aircraft LED light unit is at least one of the following: a projector light, a flood light, a taxi light, a landing light, a runway turnoff light, a head light, a search light.

Exemplary embodiments of the invention further include an aircraft, in particular an air plane or helicopter, comprising at least one aircraft LED light unit as described herein, which is disposed inside or externally on the aircraft. In a particular implementation, the aircraft LED light unit is disposed externally on the aircraft, i.e. is an exterior aircraft LED light unit.

BRIEF DESCRIPTION OF THE DRAWINGS

Further aspects and exemplary embodiments of the invention are described with respect to the accompanying drawings, wherein.

DETAILED DESCRIPTION

Figure 2:
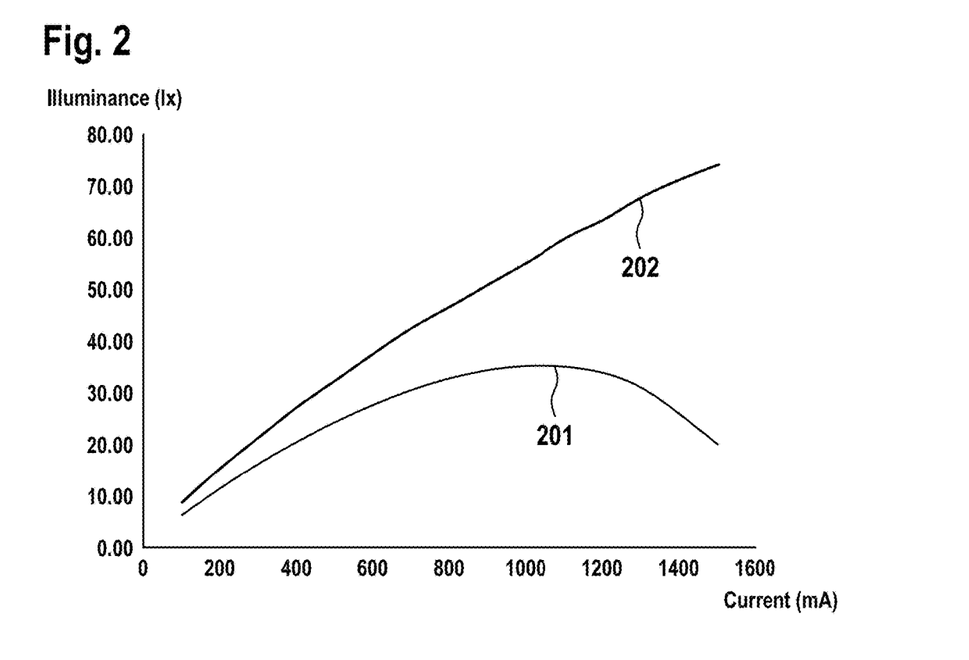
FIG. 2 shows a diagram of two exemplary characteristics of an LED performance depending on current through the LED.

FIG. 2 shows a diagram of two exemplary characteristics of an LED performance depending on current through the LED. The two characteristics shown in FIG. 2 are to be understood as only exemplary for illustrating a typical behaviour of an LED when operated at different currents. The lower characteristic 201 shows an illuminance in lux (lx) of the light radiation emitted by an LED measured at a particular distance from the LED when operated at different currents. It can be seen that with increasing current, the performance of the LED is decreasing in a downward curve, that is the harder the LED is operated, the less light is emitted due to an increase in junction temperature, which results in thermal overload and reduced performance and efficiency. This is particular the case when the LED is operated without a thermal pad, i.e. only the anode and cathode pads are responsible for thermal transfer from the LED junction to the printed circuit board (PCB).

The other characteristic 202 shows an illuminance in lux (lx) of the light radiation emitted by an LED measured at a particular distance from the LED when operated at different currents, but with improved thermal transfer of heat from the LED junction, for example as achieved according to embodiments of the invention. For example, with optimal thermal transfer from the LED junction, the illuminance does not show a significant decrease over varying operating current. Thus, especially for high power operation of an LED at higher currents, the illuminance can be increased accordingly, e.g. proportionally, so that the light emission and performance can be increased accordingly depending on the supplied current.

Figure 3:
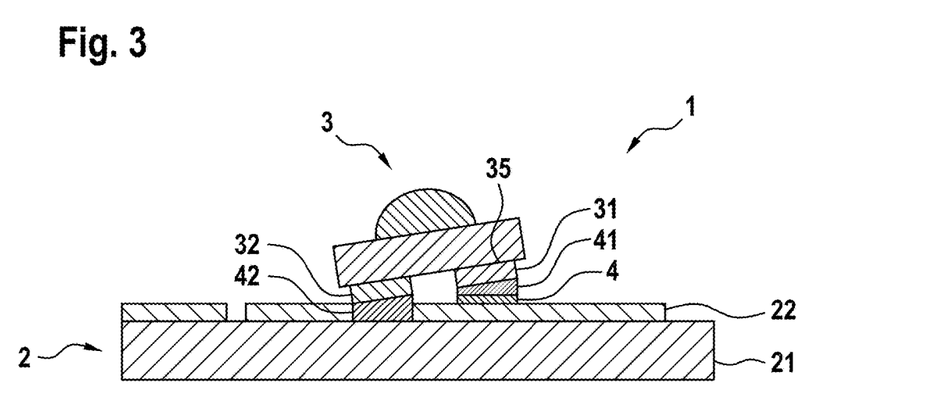
FIG. 3 shows an embodiment of an aircraft LED light unit comprising an LED disposed on a printed circuit board.

FIG. 3 shows an embodiment of an aircraft LED light unit 1 comprising an LED 3 disposed on a printed circuit board 2. The printed circuit board (PCB) 2 comprises at least one metal core layer 21 and at least one dielectric layer 22. Particularly, the dielectric layer 22 is disposed on the metal core layer 21 and carries one or more electrical conductors, such as conductor paths or tracks, disposed on the dielectric layer 22, like the ones shown in FIG. 1 at 103 and 104. For example, the embodiment of FIG. 3 shows an electrical conductor 4 disposed on the dielectric layer 22. The electrical conductor 4 may be a part of a conductor path or track disposed on the dielectric layer 22. The dielectric layer 22 electrically isolates the electrical conductor 4 (and any further conductor paths or tracks on the PCB) from the metal core layer 21. For example, the metal core layer 21 may be made of or may comprise copper.

Generally, according to an embodiment, the metal core layer of a PCB as used in connection with embodiments of the invention is arranged as a metal layer (particularly with the shape of a plane) within the PCB. Particularly, the metal core layer is one of multiple layers of the PCB and extends over the two-dimensional extensions (i.e. the two-dimensional plane) of the PCB.

Typically, PCBs with a metal core layer, such as PCB 2 shown in FIG. 3, have a dielectric layer between the conductor paths or tracks and the metal core layer to keep the metal core layer electrically isolated. On the other hand, the dielectric layer makes the LEDs disposed thereon almost isolated from the metal core layer in terms of thermal connection. This may lead to negative effects regarding LED performance and efficiency, such as shown with curve 201 according to FIG. 2.

Figure 8A:
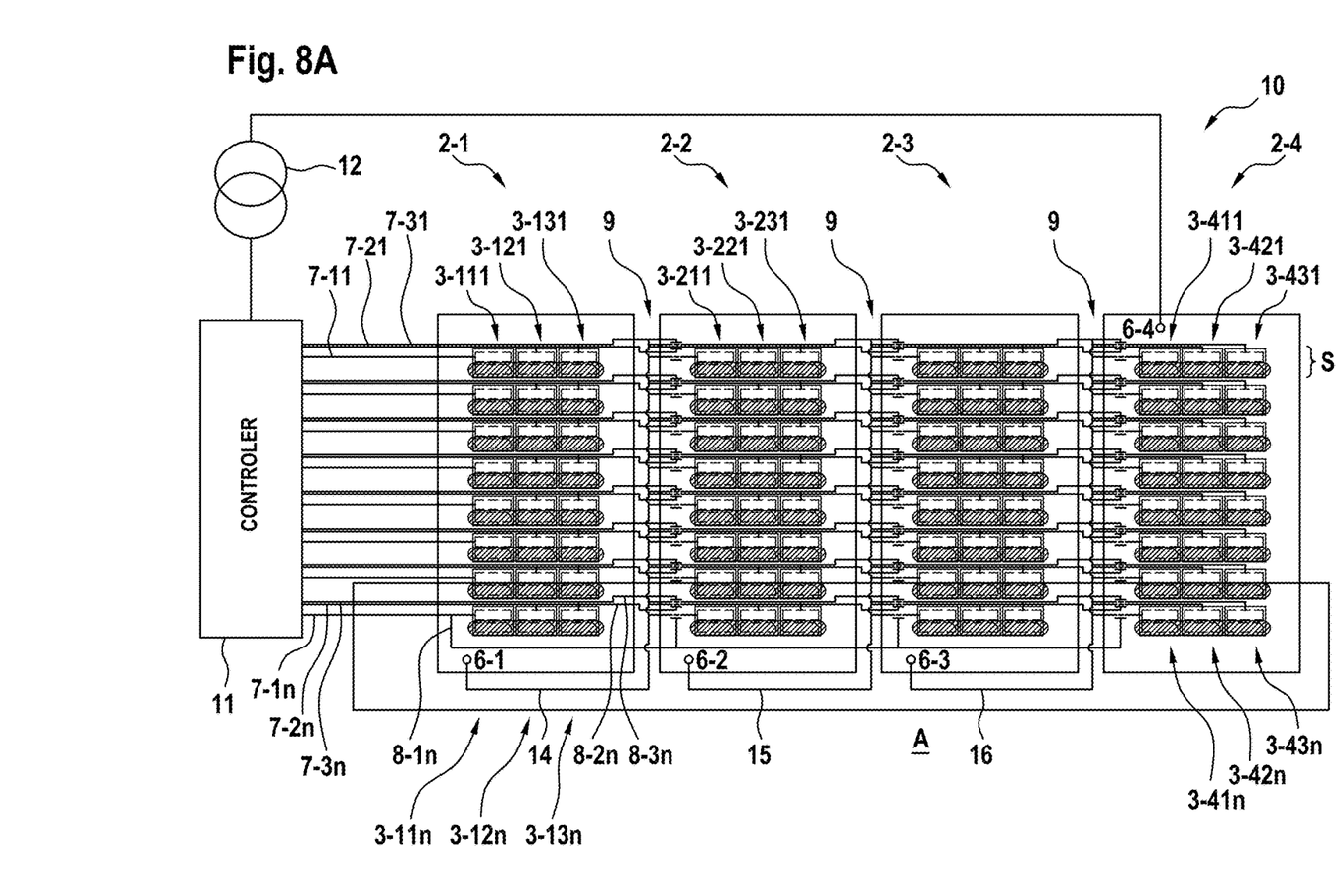
FIG. 8A shows a further embodiment of an aircraft LED light unit comprising multiple printed circuit boards, each one comprising a plurality of LEDs disposed thereon in a respective array of LEDs.

As further shown in FIG. 3, at least one LED 3 is disposed on the PCB 2. The LED 3 comprises an anode 31 and a cathode 32 for electrically coupling to a power source, not shown in FIG. 3 (an exemplary power source 12, which can also be used with an LED 3 according to FIG. 3, is shown in FIG. 8A explained in more detail below). It should be understood that the LED may be coupled to the power source also in other flow direction. That is, all which is referred to herein to be in relation to the anode of the LED can also be applied in the same way in relation to the cathode of the LED and vice versa, i.e. anode and cathode are interchangeably referred to herein.

According to the embodiment shown in FIG. 3, one of the anode 31 and cathode 32 of the LED 3 (in the present case anode 31) is electrically connected to the electrical conductor 4 disposed on the dielectric layer 22, and the other one of the anode 31 and cathode 32 of the LED 3 (here the cathode 32) is electrically connected to the metal core layer 21 of the PCB 2. A first soldering material 41 is arranged between the anode 31 of the LED 3 and the electrical conductor 4, whereas a second soldering material 42 is arranged between the cathode 32 of the LED 3 and the metal core layer 21. The soldering material 42 is arranged in an opening of the dielectric layer 22 in which the metal core layer 21 is not covered by the dielectric layer 22. Electrical conductor 4 and metal core layer 21 may each be coupled to respective opposite supply terminals of a power source, as explained in more detail below.

In the present embodiment of FIG. 3, the LED 3 is tilted with respect to the PCB 2. Particularly, the LED 3 has an emission plane 35 from which light radiation is emitted by the LED 3, which emission plane 35 is tilted with respect to the PCB 2. For example, the emission plane 35 is forming a lower part of the housing of the LED. For instance, the LED junction from which light is radiated is comprised in the emission plane 35. Light may be emitted from the emission plane 35 in perpendicular direction with respect to the emission plane. Light may also be emitted from the emission plane in other directions. The tilting of the LED 3 basically results from the removal of the dielectric layer 22 under the cathode 32 without increasing the amount of soldering material 42 with respect to the soldering material 41. Thus, the difference in total height of the layers under the anode and cathode results in tilting of the LED 3.

Figure 4:
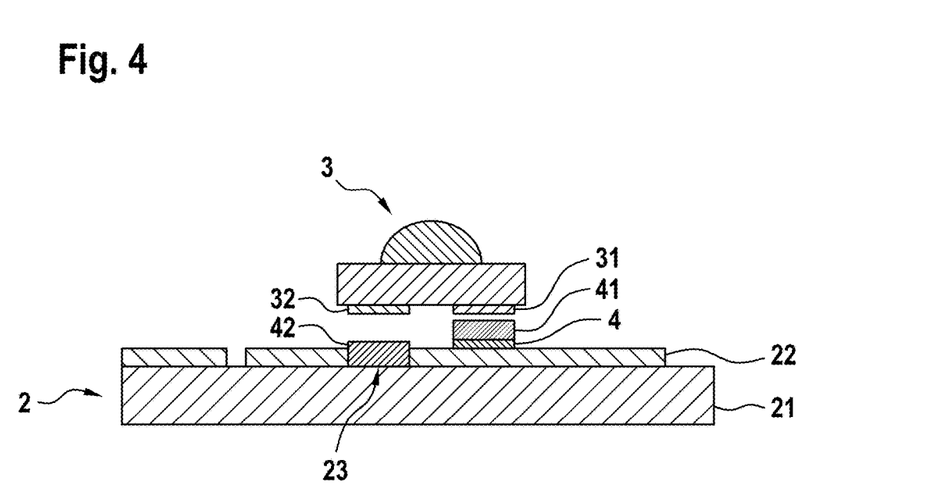
FIGS. 4-6 show a process of manufacturing an aircraft LED light unit comprising an LED disposed on a printed circuit board.
Figure 5:
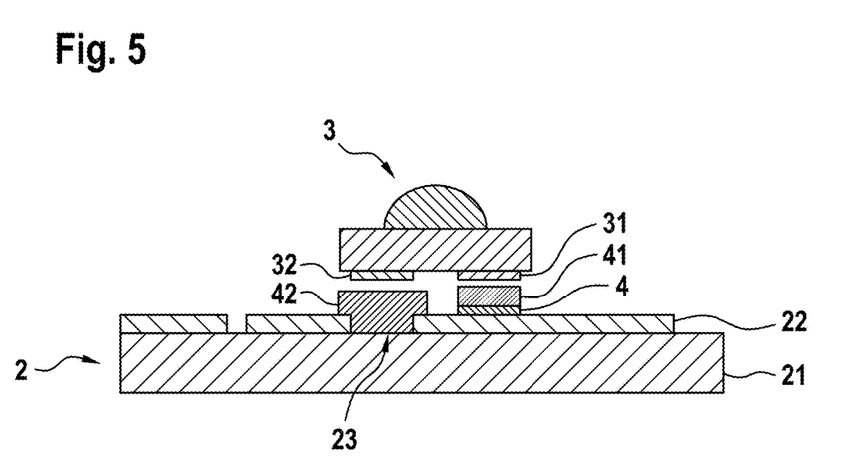
Figure 6:
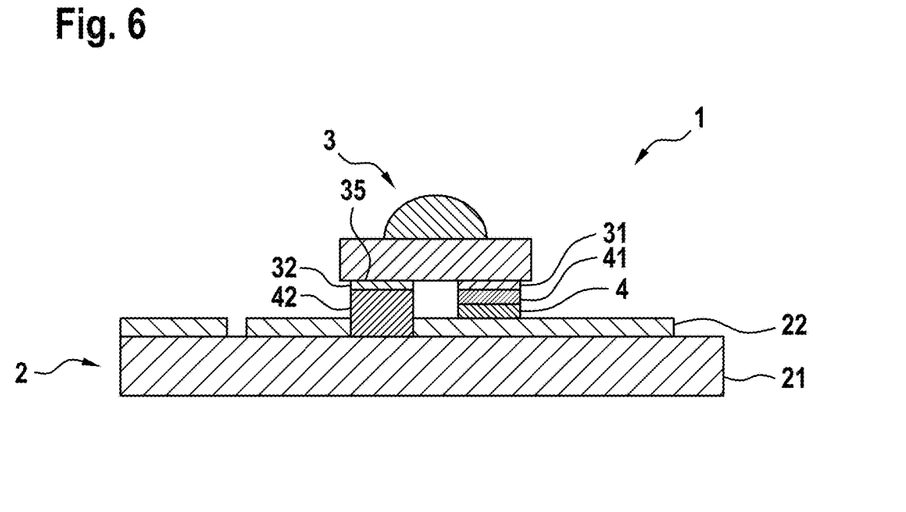

FIGS. 4-6 show a process of manufacturing an aircraft LED light unit 1 comprising an LED 3 disposed on a PCB according to another embodiment. In FIG. 4, soldering material 42 is filled in an opening 23 of the dielectric layer 22 in which the metal core layer 21 is not covered by the dielectric layer 22. Likewise, soldering material 41 is disposed on top of electrical conductor 4. In the embodiment of FIG. 4, the soldering materials 41 and 42 have substantially the same amount of material, i.e. have substantially the same height or thickness. As shown in FIG. 3, this may lead to tilting of the LED 3 if attached on soldering materials 41 and 42.

According to the embodiment of FIG. 5, the amount of soldering material 42 filled in the opening 23 of the dielectric layer 22 is increased as compared to soldering material 41. Once the soldering material 42 has hardened, its extension slightly changes as shown in FIG. 6.

For example, according to the embodiment of FIG. 6, the soldering material 42 has an extension between the PCB 2 and the LED 3 (i.e. in vertical direction) which is dimensioned so that the emission plane 35 of the LED 3 is substantially parallel to the PCB 2. That is, the amount of soldering material 42 with respect to the soldering material 41 is chosen such that the LED 3 (particularly its emission plane 35) is parallel to the PCB 2, i.e. not tilted. This can be achieved with the soldering material 42 having a greater extension between the PCB 2 and the LED 3 than the soldering material 41.

In order to have the LED 3 arranged in parallel to the PCB 2, the soldering material 42 has an extension between the PCB 2 and the LED 3 (i.e. vertical extension) which is substantially equal to the sum of the (vertical) extension of the soldering material 41 and the thicknesses of the layers 4 and 22 arranged between the anode 31 and the metal core layer 21.

For example, material of the dielectric layer 22 under one of the anode or cathode pads is removed and then filled with the soldering material 42 in a first step, and then the LED 3 is soldered onto the PCB in a second step. The result is that there is no barrier for thermal transfer (heat flow) from the LED junction of LED 3 to metal core layer 21. However, as the metal core layer 21 is electrically connected to the LED 3 and power source, the PCB 2 (particularly its metal core layer 21) should be electrically isolated from any heat sink (such as a cooling body connected to the PCB). Basically, according to the present embodiment, the electrical isolation is not done between the LED and PCB as in previous approaches, but between the PCB and any heat sink connected thereto. This also reduces the number of wires and tracks on the PCB required to power the LEDs individually.

According to the arrangements of the embodiments of FIGS. 3 and 6, there is a thermal transfer from the LED junction to the metal core layer through one of the anode and cathode of the respective LED (here: the cathode 32) which results in higher LED performance and efficiency due to lower LED junction temperatures. For example, according to embodiments, the LED junction temperature can be reduced by 140 K.

Figure 7:
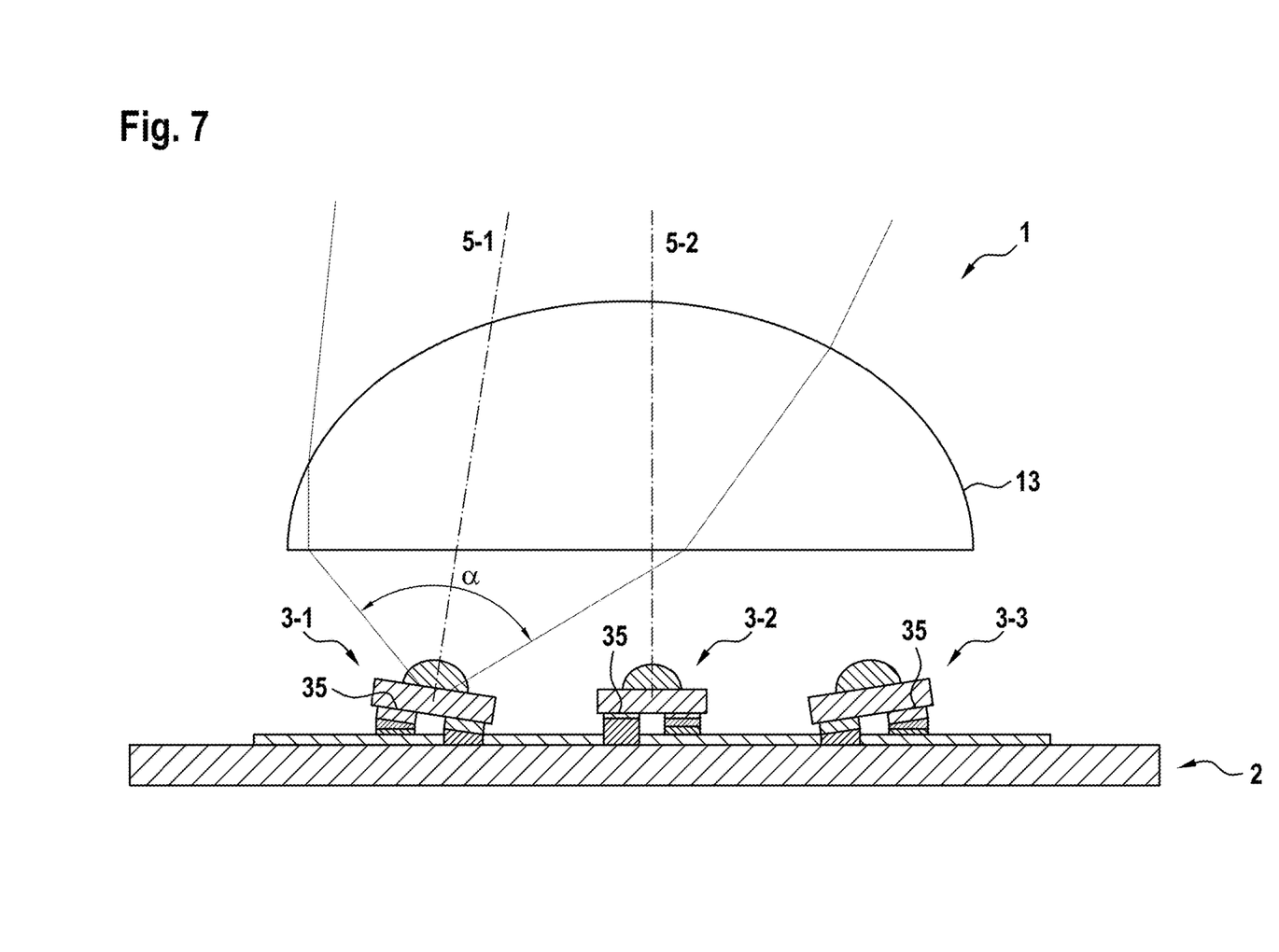
FIG. 7 shows a further embodiment of an aircraft LED light unit comprising multiple LEDs disposed on a printed circuit board.

FIG. 7 shows a further embodiment of an aircraft LED light unit 1 which comprises multiple LEDs disposed on a PCB. For example, three LEDs 3-1, 3-2, 3-3 are arranged next to each other in a row on a PCB 2, or three columns of LEDs are arranged next to each other forming an array of LEDs, wherein LEDs 3-1, 3-2, 3-3 are part of a respective column. As shown in FIG. 7, the LEDs 3-1 and 3-3 are tilted with respect to the PCB 2, whereas the LED 3-2 is substantially parallel to PCB 2. More particularly, the emission plane 35 of the LEDs 3-1 and 3-3 is tilted with respect to the PCB 2, and the emission plane 35 of the LED 3-2 is substantially parallel to the PCB 2. Such arrangement may be used to improve useful flux for the lateral LEDs 3-1 and 3-3.

For example, the LEDs 3-1, 3-3 having the tilted emission plane 35 are arranged in a periphery of the plurality of LEDs, e.g. are lateral, or are forming part of a respective edge of an array of LEDs. For instance, the LED 3-1 is forming part of a first (here: left) edge of an LED array and LED 3-3 is forming part of an opposite (here: right) edge of the LED array.

Each one of the LEDs emits light radiation from the emission plane 35. LED 3-1 emits light 5-1 and LED 3-2 emits light 5-2, which are each illustrated with respective rays emitted from the emission plane 35 in perpendicular direction. The LEDs may emit light from the emission plane 35 in multiple directions in a bundle of rays emitted at different angles, as illustrated by angle α in FIG. 7. The bundle of emitted light rays may be focused by a lens 13. With the arrangement of FIG. 7, having lateral LEDs 3-1, 3-3 which are tilted inwardly with respect to the LED array or LED 3-2, light emitting efficiency can be further increased since more light rays of the lateral LEDs 3-1, 3-3 can be captured by the lens 13 or directed/bundled in a narrower bundle of light emitted from the PCB 2.

Figure 8B:
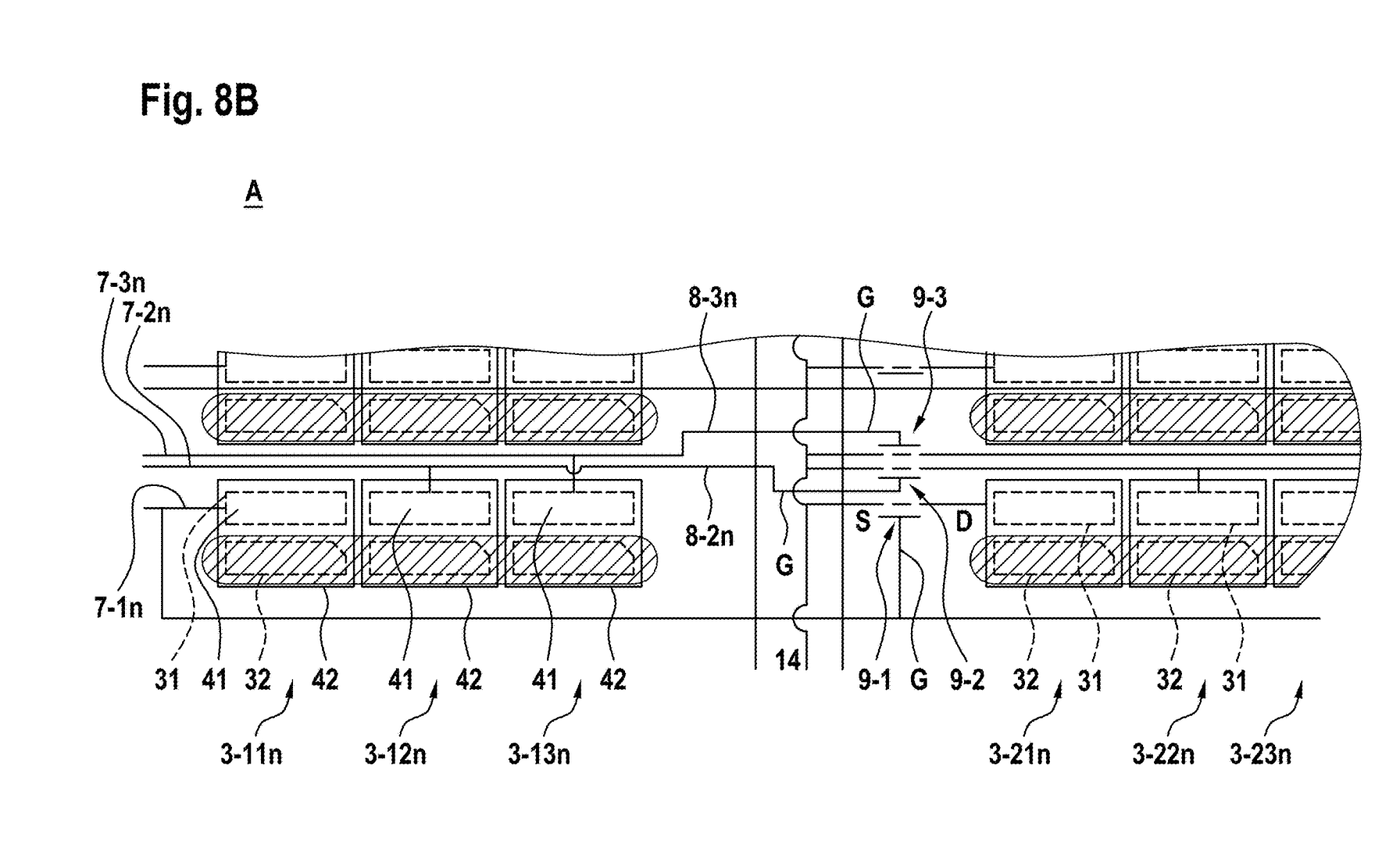
FIG. 8B shows an enlarged view of a portion of the aircraft LED light unit according to FIG. 8A.

FIG. 8A shows a further embodiment of an aircraft LED light unit, which comprises multiple PCBs, with each one of the PCBs comprising a plurality of LEDs disposed thereon in a respective array of LEDs. In this respect, FIG. 8B shows an enlarged view of a portion A of the aircraft LED light unit according to FIG. 8A.

According to the embodiment, as shown in FIG. 8A, the aircraft LED light unit 10 has multiple PCBs, here four PCBs 2-1, 2-2, 2-3 and 2-4 which each have disposed thereon an array of LEDs. For example, the PCB 2-1 comprises LEDs 3-111, 3-121, 3-131 in a first row, and LEDs 3-11$n$, 3-12$n$, 3-13$n$ in an n-th row (with n being in principle any natural number). The PCB 2-2 comprises LEDs 3-211, 3-221, 3-231 in a first row, and the PCB 2-4 comprises LEDs 3-411, 3-421, 3-431 in a first row, and LEDs 3-41$n$, 3-42$n$, 3-43$n$ in an n-th row. Thus, each of PCBs 2-1 to 2-4 comprises an array of LEDs arranged in three columns and n rows. Of course, the three columns are only exemplary, wherein in principle any number of columns can be used. Further, in principle the aircraft LED light unit 10 may comprise any number of PCBs.

The aircraft LED light unit 10 further comprises a power source 12 and a control circuit 11 that is configured to supply the respective LEDs with electrical power from the power source 12 and to control, e.g., the emitted illumination of the plurality of LEDs through on/off switching and/or adjustment of the current respectively supplied to the respective LED. In this way, the brightness of the plurality of LEDs is adjustable. In some embodiments, the control circuit may also be a part of the power source 12, e.g. of a combined power source circuit. Thus, whenever it is referred herein to a power source, this may also be understood as referring to a combination of power source 12 and control circuit 11.

More particularly, the control circuit 11 is coupled to a supply terminal of the power source 12 for receiving power from the power source 12, and provides as output respective power lines to each of the LEDs of the PCB 2-1, such as power line 7-11 for LED 3-111, power line 7-21 for LED 3-121, power line 7-31 for LED 3-131, power line 7-1$n$ for LED 3-11$n$, power line 7-2$n$ for LED 3-12$n$, and power line 7-3$n$ for LED 3-13$n$. Each one of power lines 7-11 to 7-3$n$ may be or form part of an electrical conductor 4 as shown in FIGS. 3 to 7 (analogously also for PCBs 2-2 to 2-4 with respect to lines 14, 15, 16). The LEDs of the PCB 2-1 are connected with their other ones of their anodes or cathodes to the metal core layer of the PCB 2-1, e.g. like metal core layer 21 as shown in FIGS. 3 to 7.

All LEDs of a respective PCB have common ground on single array level. This is illustrated in FIG. 8B by a shaded area which illustrates the soldering material 42 according to FIG. 3, 6 connected to the metal core layer. For example, the soldering material 42 may form a common area for all cathodes 32 of LEDs 3-11$n$, 3-12$n$, 3-13$n$ according to FIG. 8B. The anodes 31 thereof are provided with soldering material 41.

The metal core layer of the PCB 2-1 is connected to a core terminal 6-1. A power line 14 is coupled to the core terminal 6-1 and coupled to the LEDs of the PCB 2-2 as a common supply line. The power line 14 is then coupled through respective switches 9 to one of the anode and cathode of the respective LEDs on PCB 2-2, the other one of the anode and cathode is connected to the metal core layer of PCB 2-2. The metal core layer of the PCB 2-2 is connected to a core terminal 6-2, the metal core layer of the PCB 2-3 is connected to a core terminal 6-3, and the metal core layer of the PCB 2-4 is connected to a core terminal 6-4. The PCBs 2-3 and 2-4 are coupled analogously to power lines 15 and 16 coupled to core terminals 6-2 and 6-3, respectively. Core terminal 6-4 is coupled to the other supply terminal of power source 12.

To address each LED of PCBs 2-2, 2-3 and 2-4 individually, switches 9 are provided which are controlled by respective control lines, such as 8-1$n$, 8-2$n$, 8-3$n$. In the embodiment of FIG. 8, the control lines are extended power lines, i.e. are coupled to the respective power lines for driving a control terminal of a respective switch. For example, control line 8-1$n$ is coupled to power line 7-1$n$, control line 8-2$n$ is coupled to power line 7-2$n$, and control line 8-3$n$ is coupled to power line 7-3$n$.

For example, the switches 9 are semiconductor switches, such as a transistor, like a field effect transistor (FET). They are only shown as symbols in FIG. 8. By means of the switches 9, the use of undesirable, low voltage, high current circuitry, which would result in large, yet inefficient drivers, may be avoided.

For example, taking LED 3-11$n$ of PCB 2-1 and LED 3-21$n$ of PCB 2-2, these are coupled in series to the power source 12 and control circuit 11, respectively. A switch 9-1 is coupled between the LED 3-11$n$ (and others of PCB 2-1) and LED 3-21$n$. The switch 9-1 has a controlled path (such as a path between source S and drain D of a transistor, illustrated with switch 9-1) coupled to the core terminal 6-1 through power line 14 and to a first terminal of the LED 3-21$n$ (e.g. the anode). The second terminal (e.g. cathode) of the LED 3-21$n$ is connected to metal core layer of PCB 2-2. The switch 9-1 further has a control terminal G (such as a gate terminal of a transistor) which is coupled to the control line 8-1n, i.e. to the terminal of the LED 3-11n which is coupled to power line 7-1n from control circuit 11. Switches 9-2 and 9-3 are connected analogously with respect to LEDs 3-12n, 3-13n, 3-22n, 3-23n.

In this way, four LEDs are coupled in series to the power source 12 in a respective string S. Particularly, one of the anode and cathode of each one of the LEDs on the PCB 2-1 is coupled to a first terminal of the power source 12, and the other one of the anode and cathode of each one of the LEDs on the PCB 2-1 is connected to the metal core layer of the PCB 2-1. Further, one of the anode and cathode of each one of the LEDs on the PCB 2-2 is coupled to the metal core layer of the PCB 2-1, and the other one of the anode and cathode of each one of the LEDs on the PCB 2-2 is connected to the metal core layer of the PCB 2-2 which is coupled (via the other PCBs 2-3, 2-4) to a second terminal of the power source 12.

Each one of the switches 9 is coupled (with its controlled path) between the metal core layer of the PCB 2-1 and a respective LED of the PCB 2-2, particularly to one of the anode and cathode of the respective LED. Each one of the switches 9 further has a respective control terminal G which is coupled to the power source through the respective power lines 7-11 to 7-3n.

It should be noted that four LEDs coupled in a string S is only a suitable embodiment. In certain implementations, a string of four or more LEDs is desirable to keep the efficiency high and limit the maximum current supplied by power source 12 through power lines 7-11 to 7-3n.

According to an embodiment, the PCBs 2-1 to 2-4 are comprised in a projector module formed by the LED light unit 10. For example, the projector module comprises at least four arrays of LEDs, with each one of the arrays arranged on a respective PCB, as shown in FIG. 8A. The illumination provided by the projector module may be adjusted by the control circuit 11 appropriately, e.g. by adjusting the current supplied to the LEDs, and/or by adjusting (e.g. by switching on/off) which strings of LEDs are powered through power lines 7-11 to 7-3n.

According to embodiments of the invention, high power compact LEDs having no or limited space for conventional thermal pads can nonetheless be operated efficiently. The number of wires and conductor tracks on a PCB can be reduced. Dense LED arrays can be driven at maximum power without overheating. Thus, an optical system including such LED light unit can be made more efficient than in conventional arrays. The efficiency can be further increased by using the tilting feature for the lateral LEDs or rows/columns of LEDs, as for instance shown in FIG. 7.

According to exemplary embodiments, the aircraft LED light unit 10 as shown in FIG. 8A is an exterior aircraft LED light unit. The high efficiency and performance of the LEDs due to lower thermal load of the LED junction makes it feasible to employ the LED light unit is an exterior aircraft LED light unit, such as a projector light, a flood light, a taxi light, a landing light, a runway turnoff light, a head light, and/or a search light.

While the invention has been described with reference to exemplary embodiments, it will be understood by those skilled in the art that various changes may be made and equivalents may be substituted for elements thereof without departing from the scope of the claims. In addition many modifications may be made to adopt a particular situation or material to the teachings of the invention without departing from the essential scope thereof. Therefore, it is intended that the invention not be limited to the particular embodiment disclosed, but that the invention include all embodiments falling within the scope of the claims.

The invention claimed is:

1. An aircraft LED light unit comprising:
   at least one printed circuit board which comprises at least one metal core layer and at least one dielectric layer,
   at least one LED disposed on the printed circuit board and which comprises an anode and a cathode for electrically coupling to a power source,
   wherein one of the anode and cathode of the at least one LED is connected to an electrical conductor which is disposed on the dielectric layer and is coupled to a first terminal of the power source, wherein the dielectric layer electrically isolates the electrical conductor from the metal core layer, and
   the other one of the anode and cathode of the at least one LED is connected to the metal core layer of the at least one printed circuit board, wherein the metal core layer is coupled to a second terminal of the power source,
   wherein the aircraft LED light unit further comprises:
   a first soldering material arranged between the one of the anode and cathode of the at least one LED and the electrical conductor, and
   a second soldering material arranged between the other one of the anode and cathode of the at least one LED and the metal core layer,
   wherein the second soldering material has a greater extension between the printed circuit board and the LED than the first soldering material, and
   wherein the second soldering material is arranged in an opening of the dielectric layer in which the metal core layer is not covered by the dielectric layer.

2. An aircraft LED light unit according to claim 1, wherein
   the at least one LED has an emission plane from which light radiation is emitted by the LED, and
   the soldering material has an extension between the printed circuit board and the LED, the extension being dimensioned so that the emission plane of the at least one LED is substantially parallel to the printed circuit board.

3. An aircraft LED light unit according to claim 1, wherein
   the first soldering material has a first extension between the printed circuit board and the LED and the second soldering material has a second extension between the printed circuit board and the LED,
   wherein the second extension is substantially equal to the sum of the first extension and the thicknesses of layers arranged between the one of the anode and cathode of the at least one LED and the metal core layer.

4. An aircraft LED light unit according to claim 1, wherein
   the at least one LED has an emission plane from which light radiation is emitted by the LED, and
   the emission plane of the at least one LED is tilted with respect to the printed circuit board.

5. An aircraft LED light unit according to claim 1, comprising
   a plurality of LEDs arranged on the printed circuit board,
   wherein each of the plurality of LEDs has an emission plane from which light radiation is emitted by the respective LED, and
   the emission plane of at least one of the plurality of LEDs is tilted with respect to the printed circuit board and the emission plane of at least another one of the plurality of LEDs is substantially parallel to the printed circuit board.

6. An aircraft LED light unit according to claim 5, wherein the at least one of the plurality of LEDs having the tilted emission plane is arranged in a periphery of the plurality of LEDs.

7. An aircraft LED light unit according to claim 6, comprising
at least a first and a second LED coupled in series to the power source, wherein each of the first and second LED has a first terminal and a second terminal, and
a switch coupled between the first and second LED, the switch having a controlled path (S-D) coupled to the second terminal of the first LED and to the first terminal of the second LED, the switch further having a control terminal (G) which is coupled to the first terminal of the first LED.

8. An aircraft LED light unit according to claim 7, comprising
a plurality of LEDs arranged on the printed circuit board in an array of LEDs, wherein one of the anode and cathode of each one of the plurality of LEDs is coupled to the first terminal of the power source, and the other one of the anode and cathode of each one of the plurality of LEDs is connected to the metal core layer which is coupled to the second terminal of the power source.

9. An aircraft LED light unit according to claim 1, comprising
a plurality of LEDs arranged in at least a first array of LEDs on a first printed circuit board and a second array of LEDs on a second printed circuit board,
wherein one of the anode and cathode of each one of the plurality of LEDs in the first array is coupled to the first terminal of the power source, and the other one of the anode and cathode of each one of the plurality of LEDs in the first array is connected to the metal core layer of the first printed circuit board, and
one of the anode and cathode of each one of the plurality of LEDs in the second array is coupled to the metal core layer of the first printed circuit board, and the other one of the anode and cathode of each one of the plurality of LEDs in the second array is connected to the metal core layer of the second printed circuit board which is coupled to the second terminal of the power source.

10. An aircraft LED light unit according to claim 9, further comprising
a plurality of switches, wherein each one of the plurality of switches is coupled between the metal core layer of the first printed circuit board and a respective LED of the second array,
each one of the switches having a controlled path (S-D) coupled to the metal core layer of the first printed circuit board and to one of the anode and cathode of the respective LED of the second array, and
each one of the switches further having a control terminal (G) which is coupled to the first terminal of the power source.

11. An aircraft LED light unit according to claim 10, wherein the printed circuit board, or the first printed circuit board and second printed circuit board, respectively, is comprised in a projector module.

12. An aircraft LED light unit according to claim 11, wherein the aircraft LED light unit is an exterior aircraft LED light unit, particularly wherein the aircraft LED light unit is at least one of: a projector light, a flood light, a taxi light, a landing light, a runway turnoff light, a head light, a search light.

13. An air plane, comprising at least one aircraft LED light unit according to claim 1, disposed inside or externally on the aircraft.

* * * * *